United States Patent [19]

Golden

[11] Patent Number: 4,635,368

[45] Date of Patent: Jan. 13, 1987

[54] APPARATUS FOR MAKING ELECTRONIC CIRCUIT BOARDS

[76] Inventor: Michael G. Golden, 13914 Oakgreen Cir., Afton, Minn. 55001

[21] Appl. No.: 639,591

[22] Filed: Aug. 10, 1984

[51] Int. Cl.$^4$ .............................................. B43L 13/10
[52] U.S. Cl. .................................................... 33/23.03
[58] Field of Search .................. 33/18 R, 23 R, 23 C, 33/23 B, 23 K, 23 H, 25 R, 25 B, 32 D, 32 E, 33/24 C, 24 R

[56] References Cited

U.S. PATENT DOCUMENTS

| | | | |
|---|---|---|---|
| 2,203,389 | 6/1940 | Kurtz | 409/96 X |
| 2,226,677 | 12/1940 | Vikhman | 409/96 |
| 3,183,745 | 5/1964 | Barron | 82/18 |
| 3,292,495 | 12/1966 | Hill et al. | 409/99 X |
| 3,372,618 | 1/1966 | Barron | 409/96 |
| 3,716,668 | 2/1973 | Barron | 358/299 |
| 4,012,027 | 3/1977 | Hooper | 33/23 C X |
| 4,052,739 | 10/1977 | Wada et al. | 358/299 |
| 4,138,924 | 2/1979 | Seebach | 409/96 X |
| 4,157,552 | 6/1979 | Nakajima | 33/18 R X |

Primary Examiner—Harry N. Haroian
Attorney, Agent, or Firm—William O. Ney

[57] ABSTRACT

An apparatus for the automatic preparation of a prototype electronic circuit board from an electronic circuit layout comprising an X-Y-moveable worktable and a fixedly mounted engraving head which is controlled by electronic signals from a photoelectric means scanning the layout.

4 Claims, 2 Drawing Figures

APPARATUS FOR MAKING ELECTRONIC CIRCUIT BOARDS

This invention relates to the manufacture of electronic circuit boards of the type generally produced by printing techniques and therefore referred to as "printed circuit boards".

BACKGROUND OF THE INVENTION

Circuit boards are typically made from a laminate of a layer of conductive metal, especially copper, and a substrate of insulating material. A pattern of etch resistant material is placed on the conductive metal layer by printing or by a photographic process. The conductive metal not covered by the etch resistant material is etched away chemically leaving on the insulating substrate metal that was protected by the resist material in accordance with the desired circuit. Although the printing and photographic processes are rapid and amenable to high volume production of electronic circuit boards, they are labor intensive for small numbers of circuit boards and therefore costly for the production of prototype and experimental circuit boards. Furthermore, because of the solvents used in the coating and development of the resist coatings, these processes are environmentally undesirable and require steps to recover the solvents in order to avoid pollution of the atmosphere. Also, because the waste etchant solutions contain ferric chloride, chromic acid, ammonium persulfate, or the like, costly steps must be taken to dispose of the waste solutions in order to avoid pollution of streams.

Electronic circuit boards have also been produced by processes not involving the use of resist materials and etching solutions. Thus, it is known to produce circuit boards by electronically guiding a rotatory bit. This process, however, produces coarse circuits inappropriate for production of today's high density circuits and also requires frequent replacement of the rotatory bit. Engraving processes are known, as are described in U.S. Pat. Nos. 3,183,745, 3,372,618, and 3,716,668 among others, whereby electrical circuit boards are produced using an apparatus having a cylinder on which is wrapped in side-by-side relation an image to be reproduced and a plate to be engraved with such image. The apparatus has a scanning member and a cutting member arranged adjacent respective portions of the cylinder for cooperation with the image and the plate to be engraved, respectively. If a flat circuit board is desired, it is necessary to engrave with this type of apparatus a suitable flexible plate, which after having a circuit cut into it, can be flattened and fastened to a rigid support.

There is also disclosed in U.S. Pat. No. 4,052,739 an electronic engraving system whereby an image of a person is converted by means of a television camera into electronic signals that can be used to produce the image in a plastic card such as a credit card. By such a system, there is used an engraving means comprising an engraving head having an engraving style adapted for vertical movement in response to the elctric signals and arranged to face an engraving table on which the plastic card is placed. The engraving table is reciprocated by a hydraulic cylinder from side to side. With each stroke the engraving head is displaced traversely with respect to the direction of movement of the engraving table.

SUMMARY

In accord with this invention, there is provided a method and apparatus for the production of prototype flat electronic circuit boards that eliminates the need of photoresists, circuit masks, darkrooms, exposure making equipment and etching solutions, the requirement for the lamination of a flexible circuit to a rigid support, and continuous operator involvement.

Specifically, the apparatus and method of this invention for making prototype electronic circuit boards comprises, in combination, a worktable moveably mounted on a base and supporting the flat circuit board blank during fabrication of an electronic circuit board and having means for reciprocatively moving the worktable in a first direction and means for moving the worktable in incremental steps in a second direction perpendicular to the first direction, an engraving head secured to the base and having a cutting style positioned to face the circuit board blank that is supported on the worktable and is capable of being advanced into a cutting mode and withdrawn into a non-cutting mode in response to an electronic signal as the worktable moves in the first and second directions, a photoelectric scanning means positioned to scan an electronic circuit layout and thereby generate an electronic signal corresponding to desired conductive and non-conductive portions of the electronic circuit layout, and means for controlling the advancement of the cutting style from a non-cutting mode into a cutting mode or the withdrawal of the cutting style from a cutting mode into a non-cutting mode in response to the electronic signal.

Although the photoelectric scanning means positioned to scan an electronic circuit layout and generate an electronic signal for control of the cutting style can be located remotely from the base of the apparatus of the invention, it is preferable that the photoelectric scanning means be fixedly mounted to the base and positioned to scan an electronic circuit layout of a desired electronic circuit that is secured to the worktable in side-by-side relationship to the flat circuit board blank.

Most preferably, either or both of the photoelectric scanning means and the engraving head are secured to a supporting arm that is mounted on said base and can be pivoted to present the photoelectric scanning means to the electronic circuit layout and to present the cutting style of the engraving head to the circuit board blank.

The above and other features and advantages of my invention will become better understood from the detailed description of the invention that follows, when considered in connection with the accompanying drawings.

DETAILED DESCRIPTION OF THE INVENTION

Figure 1:
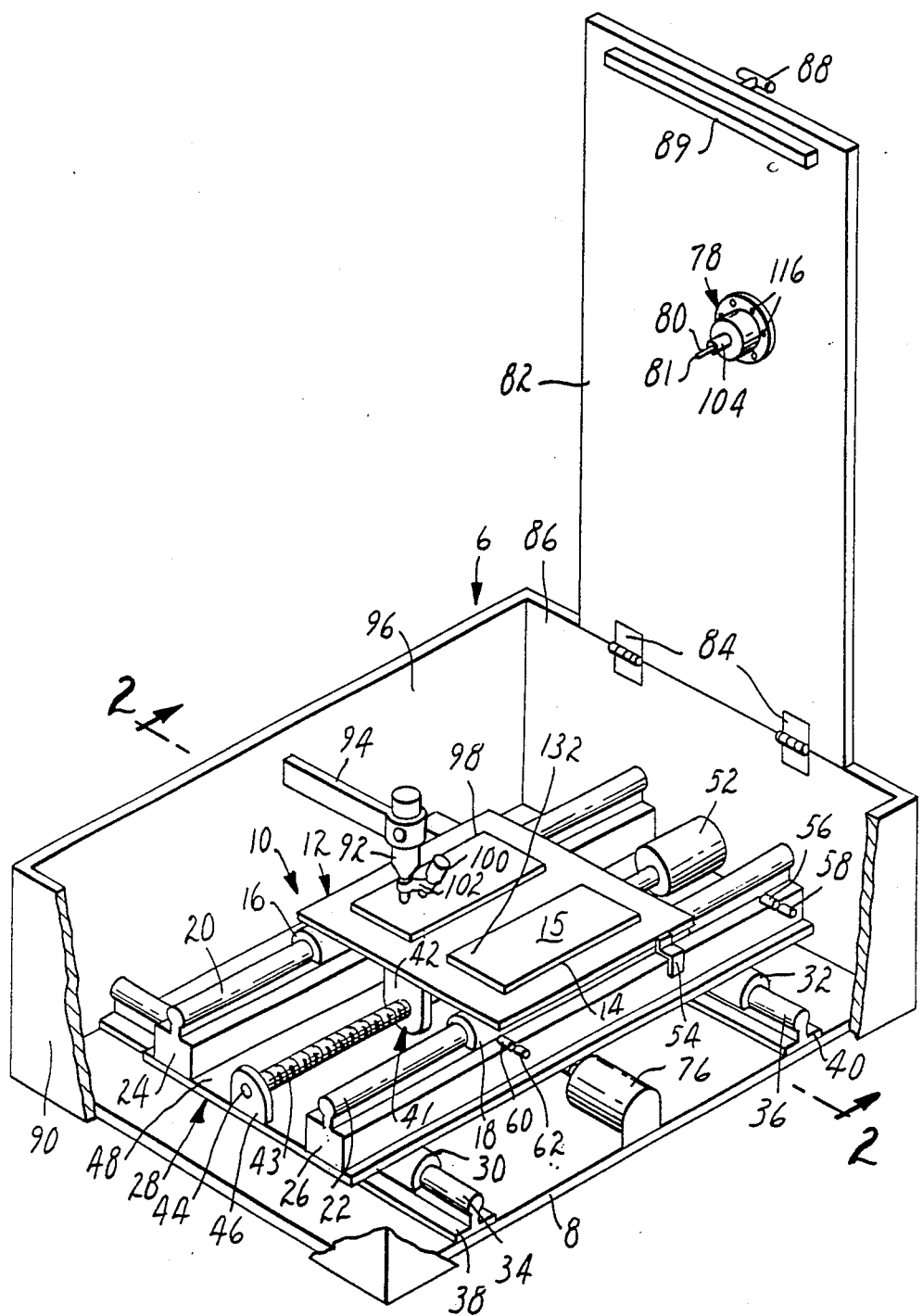
FIG. 1 is a perspective view of the apparatus for making electronic circuit boards embodying the present invention.

Referring now to FIG. 1, there is shown electronic circuit board making apparatus 6 having baseplate 8 on which is mounted X-Y moveable table 10 having an upper worktable 12 and a lower Y-table 28. The upper worktable 12 reciprocates in the X direction on linear bearings 16 and 18 that slide on rails 20 and 22 that, in turn, are mounted via mounts 24 and 26 on Y-table 28. Y-table 28, which is moved in an incremental stepping motion in a Y-direction perpendicular to the X-direction, is mounted on two linear bearings 30 and 32 that slide on rails 34 and 36 that are mounted via mounts 38 and 40 on apparatus baseplate 8.

Worktable 12 is reciprocated on rails 20 and 22 by any suitable means. Preferably, worktable 12 is reciprocated by means of a Thompson linear ball drive 41 having ball nut 42 and ball screw 43. Ball nut 42, riding on ball screw 43, is secured to the lower surface of worktable 12. One end of ball screw 43 is journalled in bearing 44 which is mounted via mount 46 onto the upper surface 48 of Y-table 28 and the other end of ball screw 42 is coupled via coupling, now shown, to reversible motor 52 that powers the ball drive 41. Reversible motor 52 is also mounted on the upper surface 48 of Y-table 28. Reciprocation of worktable 12 is accomplished by means of machine control electronics, not shown, as follows. Attached to the laterally moveable side of worktable 12 is opaque panel 54 which passes between light emitting diode 56 and photodetector 58 at a forward position of the worktable 12 (to the right in the figure) and between light emitting diode 60 and photodetector 62 at a rearward position of the worktable 12 (to the left in the figure). As the panel 54 moves between each light emitting diode and the photodetector pair, the blockage of light produces an electronic signal used by machine control electronics, not shown, to reverse the direction of rotation of electric motor 52, thus reversing the direction of movement of worktable 12.

Y-table 28 is moved in incremental steps on rails 34 and 36 by any suitable means. Preferably, Y-table 28 is stepped by a linear ball drive, not shown, with a ball nut, not shown, riding on a ball screw, not shown, that is secured to the lower surface of Y-table 28. One end of the ball screw is journaled in bearing, not shown, which is mounted via mount, not shown, onto the apparatus base 8 and the other end of ball screw is coupled via coupling, not shown, to stepping motor 76 that powers the ball drive, not shown. Stepping motor 76 is also mounted on apparatus base 8. The stepping of motor 76 is accomplished by the machine control electronics, not shown, which is triggered by the electronic signal produced when panel 54 passes between light emitting diode 56 and photodetector 58. The movement of Y-table 28 by machine control electronics is controlled to between 25 to 250 micrometers per step, preferably about 100 micrometers per step.

Engraving head 78 having engraving style 80 attached to style holder 104 that is adapted for vertical movement is fixedly mounted on pivot arm 82, shown in a vertical position, that pivots from vertical to horizontal position at hinge 84 to present the engraving style 80 to a circuit board blank at position 14. Pivot arm 82 is mounted by hinge 84 to fixed upright wall 86 which, in turn, is fixedly mounted to apparatus baseplate 8. Pivot arm 82 has at its distal edge bar 89 which, on pivoting pivot arm 82 to the horizontal position rests on fixed upright wall 90 at a position, not shown, that has been cut away to show interior of apparatus 6. The spacing between pivot arm 82 and bar 89 is adjustable by means of vernier screw 88. By turning vernier screw 88 when pivot arm 82 is in the horizontal position, pivot arm 82 can be raised or lowered and with it the distance between the cutting edge 81 of style 80 and the surface 15 of a circuit board secured at position 14 can be adjusted.

The electronic signal of a desired electronic circuit is provided in one embodiment of the invention by photoelectric scanning means 92 that is supported by support beam 94 which is mounted on fixed upright wall 96 which, in turn, is fixedly mounted on apparatus baseplate 8. Support beam 94 is located so that scanning means 92 is normal to the surface of worktable 12 and will scan a circuit board layout placed at circuit layout position 98 on movement of X-Y table 10. Illumination of the image scanned is provided by light source 100 that is attached by bracket 102 to scanning means 92.

Although any suitably sensitive photoelectric scanning means can be used, a preferable scanning means is a simple microscope having an objective lens that focuses an image of $5\times$ to $20\times$ magnification onto an image plane where a portion of the image having a diameter of about 250 to 750 micrometers is carried by fiber optics to a silicon photodetector. The electronic output of the photodector is amplified and processed by circuitry, not shown, to provide an electronic control signal for the operation of engraving head 78.

Although any suitable electromechanically operated cutting device that can be mounted on pivot arm 82 and that has a cutting style that can be advanced from a non-cutting to a cutting mode in response to an electronic signal can be used as the cutting head in my apparatus for making electronic circuit boards, it is preferable that the cutting device be one that has an electromagnetic transducer to which a cutting style is attached and can be advanced 100 to 500 micrometers from a non-cutting to a cutting mode in about 0.1 to 10 milliseconds on application of an electronic signal. An example of such a cutting device can be constructed from the speaker driver of a public address loud speaker horn having a power capacity of from about 10 to 100 watts.

Figure 2:
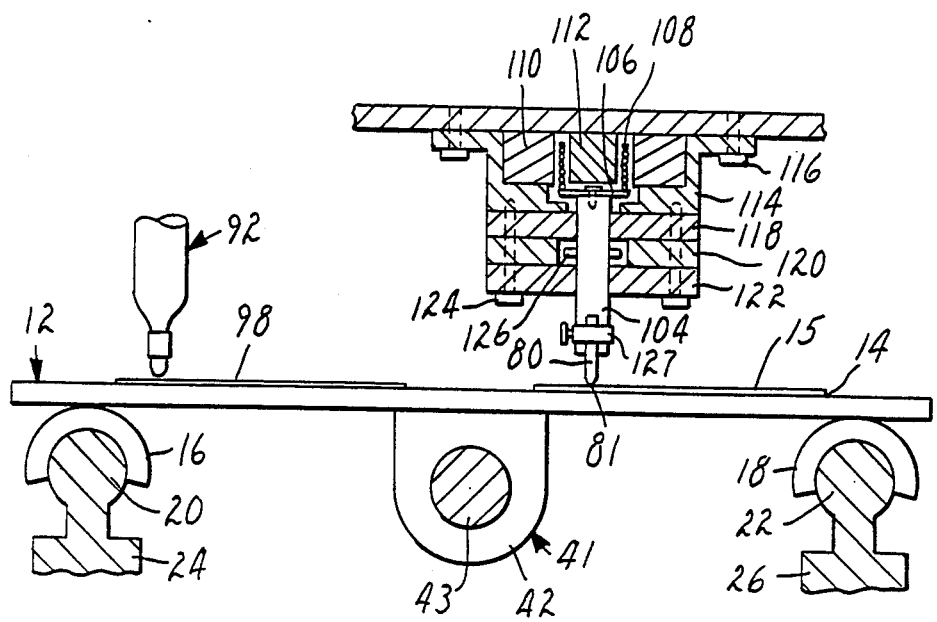
FIG. 2 is a vertical axial sectional view taken substantially along line 2—2 of FIG. 1 showing details of the engraving head 78.

To illustrate the construction of an electromagnetic tranducer from the speaker driver of a public address loud speaker, reference is made to FIG. 2. The horn of the loud speaker is removed and a style holder, a metal rod 104, is attached to speaker diaphram 106 which is secured to voice coil 108 that rides in the annular space between the poles 110 and 112 of a cylindrical magnet that are secured to speaker housing 114. The modified speaker is attached to pivot arm 82 by bolts 116. Metal rod 104 is journaled for reciprocating motion in a cylinder of three washer-shaped parts 118, 120 and 122 that are secured to speaker housing by bolts 124. Middle washer-shaped part 120 is cut out so that a pin 126 placed through metal rod 104, limits its motion to the width of the cut out minus the diameter of pin 126. Generally, this motion is 100 to 500 micrometers, preferably 250 to 375 micrometers. At the distal end of metal rod 104 is means for attachment of engraving style 80. Shown is a channel in the distal end of metal rod 104 in which engraving style 80 is held by sleeve 127 and secured by screw 128. By such an attachment, engraving styles can be readily replaced.

To produce an electric circuit board using my apparatus, a desired electronic circuit layout is secured at circuit pattern position 98 and a circuit board blank is secured at circuit board position 14. Generally, the circuit board blank and the circuit layout is held in position by pressure chips or vacuum hold downs, but any means such as double backed pressure sensitive adhesive tape can be used. To assure that the circuit diagram is smoothe, it is desirable but not necessary to cover it with a glass plate. X-Y table 10 is shifted on slide rails 20 and 22 and slide rails 34 and 36 so that photoelectric scanning means 92 will be above corner 130 of circuit layout position 98 and engraving style 80 is above corner 132 of circuit board position 14. Depending on the movement of the X-Y table, however, scanning means 92 and engraving style 80 could be placed to start above any of the other three corners of circuit layout position 98 and circuit board position 14 respectively. Pivot arm 82 is pivoted to the horizontal to present cutting edge 81 of style 80 of engraving head 78 to the surface 15 the circuit board blank at corner 132. Vernier screw 88 is rotated to adjust the height that cutting edge 81 of style 80 is above surface 15 to from 10 to 250 micrometers. Light source 100 of photoelectric scanning means 92 is activated.

Following adjustment of the positions of the engraving head 78 and the scanning means 92, motor 52 is activated via machine control logic, not shown, to move worktable 12 forward along the X-axis and carry the circuit layout under scanning means 92 and simultaneously carry the circuit board blank under the engraving head 78. As worktable 12 moves along the X-axis, scanning means 92 follows a path along the circuit layout, generating a driving or control signal to engraving head 78 which causes cutting edge 81 be withdrawn into a non-cutting mode over regions where conductive metal is not to be removed and to advance into a cutting mode over regions where conductive metal is to be removed. The travel of cutting edge 81 is limited by pin 126 to from 100 to 500 micrometers, a distance sufficient to cut through the conductive metal of a circuit board blank.

Scanning by the scanning means and cutting or not cutting by cutting means as directed or controlled by the signal from the scanning means continues as worktable 12 moves along the X-axis until opaque panel 54 interrupts the light beam between light emitting diode 60 and photodetector 62. On interuption of the light beam, the electronic signal generated triggers the machine control logic, not shown, to reverse the direction of rotation of electric motor 52 and cause worktable 12 to reverse its movement along the X-axis. The electronic signal also deactivates the scanning means so that no cutting takes place during the reverse movement along the X-axis. When opaque panel 54 interupts the light beam between light emitting diode 56 and photodetector 58, the electronic signal generated triggers the machine control logic to cause stepping motor 76 to move Y-platform 28 one step along the Y-axis preferably about 100 micrometers. The signal from photodetector 58, also triggers the return of the travel of worktable 12 along the X-axis and the reactivation of the scanning means.

The X-axis reciprocation and the Y-axis stepping of worktable 12 is continued until a light beam passing from a photoemitter to a photodetector is interrupted by an opaque panel (none of these components are shown) and generates an electronic signal to the machine control logic that turns off the electric power to the apparatus.

Suitable electric motors for use in this invention are synchronous reversible motors of the vibrationless type having 1/100 to 1/25 Hp at 115 volts. An example is the Series 200 Bodine D.C. Gear Motor available from Bodine Electric Company for use as reversible motor 52 and the Slo-Syn Synchronous Stepping Motor Model M091-FD06, available from Superior Electric Company.

The rate of operation of reversible motor 52 should be such that worktable 12 moves along the X-axis at about 2.5 to 15 centimeters per second.

Preferably, the electronic driving or control signal to engraving head 78 is not one that causes the essentially instantaneous withdrawal of engraving style 81 from a cutting to a noncutting mode but is a signal which by machine control logic directs the transitions from a cutting to a non-cutting mode to take place while the worktable travels a distance of 25 to 75 micrometers. It has been found that when the worktable travel during withdrawal of the engraving style is less than 25 micrometers, conductive metal is not cut away properly leading to residual metal curls on the circuitry of the circuit board and when more than about 75 micrometers, edge definition of the circuitry is reduced.

Electronic circuit layouts that may be used in my invention are of any desired circuit and may be hand-drawn on paper with ink or pencils, or they may be prepared by other known techniques such as by applying to a sheet of paper selected sections of tape having circuit components printed thereon.

Although my invention is particularly suitable for use in making electronic circuit boards from circuit board blanks that are not flexible and comprise a stiff layer of insulating material having on one or both sides a layer 25 to 50 micrometers thick of conductive metal, especially copper, my invention is also useful for making electronic circuits from flexible blanks that comprise a layer of plastic material such as polyester that is 100 to 300 micrometers thick having a layer of conductive metal on one or both surfaces.

The size of the circuit board blank can, of course, be varied, and the maximum size is limited only by the dimensions of the X-Y table 10. A particularly useful circuit board blank is about 12.5 centimeters by 17.5 centimeters but it can be larger or smaller.

While in the embodiment described above, the electronic signal of a desired electronic circuit is generated by a photoelectric scanning means that is mounted on a fixed upright wall, it is to be understood that the scanning means could also be mounted on a pivoting arm, especially on the same pivot arm that the engraving head is mounted. Also, while the embodiment described above utilizes as engraving head an electromagnetic tranducer that is constructed from the voice driver of a public address loud speaker, it is to be understood that any suitable transducer that can deliver sufficient force can be used. It is therefore to be understood that the method and apparatus described herein constitute a preferred embodiment of the invention and no interest is meant to limit the invention to the precise method and form of apparatus described, and that changes may be made therein without departing from the scope and spirit of the invention as defined in the appended claims.

I claim:

1. Apparatus for cutting into the surface of a flat circuit board blank to prepare an electronic circuit board comprising, in combination, (a) a worktable movably mounted on a base and supporting said flat circuit board blank during fabrication and having means for reciprocatively moving said worktable in a first direction and means for moving said worktable in incremental steps in a second direction perpendicular to said first direction, (b) an engraving head secured to said base and having a cutting style positioned to face said circuit board blank and capable of being advanced into a cutting mode or withdrawn into a non-cutting mode in response to an electric signal as said worktable moves in said first and second directions, (c) a photoelectric scanning means positioned to scan an electronic circuit layout and thereby generate an electronic signal corresonding to said electronic circuit layout, and (d) means for controlling the advancement or withdrawal of said cutting style into a cutting mode or a non-cutting mode in response to said electronic signal, in which said means further controls the withdrawal of the cutting style from the cutting mode to the non-cutting mode during the time said worktable travels 25 to 75 micrometers in said first direction.

2. Apparatus according to claim 1, wherein said photoelectric scanning means is fixedly mounted to said base and is positioned to scan an electronic circuit layout secured to said worktable.

3. Apparatus according to claim 2, wherein said engraving head is fixedly mounted on an arm pivotally mounted to said base.

4. Apparatus according to claim 2, wherein both the photoelectric scanning means and the engraving head are fixedly mounted on an arm pivotally mounted to said base.

* * * * *